United States Patent
Robin

(10) Patent No.: US 10,064,279 B2
(45) Date of Patent: Aug. 28, 2018

(54) METHOD FOR PROTECTING AN ELECTRONIC CIRCUIT CARRIER AGAINST ENVIRONMENTAL INFLUENCES AND CIRCUIT MODULE

(71) Applicant: ZF Friedrichshafen AG, Friedrichshafen (DE)

(72) Inventor: Hermann Josef Robin, Regensburg (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 0 days.

(21) Appl. No.: 15/304,768

(22) PCT Filed: Mar. 25, 2015

(86) PCT No.: PCT/EP2015/056331
§ 371 (c)(1),
(2) Date: Oct. 17, 2016

(87) PCT Pub. No.: WO2015/161971
PCT Pub. Date: Oct. 29, 2015

(65) Prior Publication Data
US 2017/0042031 A1    Feb. 9, 2017

(30) Foreign Application Priority Data

Apr. 23, 2014  (DE) .......... 10 2014 207 633

(51) Int. Cl.
*H05K 7/00* (2006.01)
*H05K 5/00* (2006.01)
(Continued)

(52) U.S. Cl.
CPC ............. *H05K 1/181* (2013.01); *H05K 3/284* (2013.01); *H05K 2203/013* (2013.01);
(Continued)

(58) Field of Classification Search
CPC ....................................................... H05K 3/12
(Continued)

(56) References Cited

U.S. PATENT DOCUMENTS

| 4,753,819 A | 6/1988 | Shimada |
| 2003/0223205 A1* | 12/2003 | Jaklin .............. B29C 45/14639 361/777 |

(Continued)

FOREIGN PATENT DOCUMENTS

| DE | 41 41 775 A1 | 6/1993 |
| EP | 0 609 478 A1 | 8/1994 |

(Continued)

OTHER PUBLICATIONS

International Search Report and Written Opinion of the International Search Authority dated Jun. 22, 2015 in International Application No. PCT/EP2015/056331 (English and German languages) (14 pp.).

(Continued)

*Primary Examiner* — Jerry Wu
(74) *Attorney, Agent, or Firm* — Brinks Gilson & Lione

(57) ABSTRACT

The present disclosure provides a method for protecting an electronic interconnect device from environmental effects. The electronic interconnect device may be connected to at least one electronic component, wherein the electronic interconnect device and the at least one electronic component are at least partially covered with an encapsulating material in a material-bonded manner. The method may include applying the encapsulating material to the electronic interconnect device with a 3D printer during a 3D printing process.

8 Claims, 2 Drawing Sheets

(51) Int. Cl.
  *H05K 1/18* (2006.01)
  *H05K 3/28* (2006.01)
(52) U.S. Cl.
  CPC ............ *H05K 2203/0756* (2013.01); *H05K 2203/1316* (2013.01); *H05K 2203/1327* (2013.01)
(58) Field of Classification Search
  USPC .................................................. 361/679.01
  See application file for complete search history.

(56) References Cited

U.S. PATENT DOCUMENTS

| | | |
|---|---|---|
| 2012/0008287 A1 | 1/2012 | Kim et al. |
| 2015/0201499 A1* | 7/2015 | Shinar .................... H05K 3/125 425/132 |

FOREIGN PATENT DOCUMENTS

| | | |
|---|---|---|
| EP | 1 351 560 A2 | 10/2003 |
| WO | WO 2005/046298 A1 | 5/2005 |

OTHER PUBLICATIONS

German Search Report dated Mar. 4, 2015 for German Patent Application No. 10 2014 207 633.1 (German language with two-page English explanations) (10 pp.).

* cited by examiner

METHOD FOR PROTECTING AN ELECTRONIC CIRCUIT CARRIER AGAINST ENVIRONMENTAL INFLUENCES AND CIRCUIT MODULE

CROSS REFERENCE TO RELATED APPLICATIONS

This application is a filing under 35 U.S.C. § 371 of International Patent Application PCT/EP2015/056331, filed Mar. 25, 2015, and claims the priority of German Patent Application 10 2014 207 633.1, filed Apr. 23, 2014. These applications are incorporated by reference herein in their entireties.

BACKGROUND

It is known, in particular for creating a motor vehicle control device, to provide a populated printed circuit board with one or more housing elements, which encompass the components on one of the two sides of the printed circuit board.

For protection against environmental effects, electronic interconnect devices are placed in a housing. A housing element of this type is made of, e.g. aluminum, plastic or a similarly suitable material. It is also known from the prior art that the housing is formed using a molding compound, wherein the circuit module is coated with the molding compound in a coating process. Among other things, it is required of a housing for an electronic circuitry that it protect the electronic circuitry from mechanical and climatic effects. Moreover, the electronic circuitry should be protected in housings from dust, foreign matter, and liquids.

When a molding compound is used as the housing, there are disadvantages with regard to processing and material costs. Furthermore, a great deal of effort is required to optimally place the molding compound in an appropriate injection tool.

The object of the present disclosure is to provide a simple and inexpensive method, with which an electronic interconnect device can be at least partially protected from environmental effects. A further object of the present disclosure is to provide a corresponding electronic circuit module.

SUMMARY

The present disclosure is based on a method for protecting an electronic interconnect device from environmental effects. The electronic interconnect device is populated thereby with at least one electronic component, wherein the interconnect device and the at least one electronic component are covered in a material-bonded manner, at least in sections, with an encapsulating material. Furthermore, an electronic interconnect device is understood to be a combination of electrical, and in particular electronic, components (e.g. diodes and transistors) to form an assembly on a printed circuit board. The encapsulating material can thus cover sections of the printed circuit board as well as sections of the electronic components disposed thereon. As a result, it is ensured that no moisture from the exterior ends up on contact points on the printed circuit board, or the electronic components.

The embodiments present disclosure are distinguished in that in a first method step, and electronic interconnect device may be provided. In another step, the encapsulating material may be applied to the electronic interconnect device by means of a 3D printing process.

The encapsulating material may be a plastic, e.g. epoxy resin, which is normally used in a 3D printing process.

One advantage of the method is that it makes an inexpensive coating (encapsulation) of the interconnect device possible. Furthermore, the method is flexible with respect to different arrangements of electronic components on electronic interconnect devices. The method can thus be quickly and easily adapted to the respective electronic interconnect devices that are to be treated.

In one embodiment of the present disclosure, the encapsulating material is melted in the 3D printing process, and applied to the electronic interconnect device in drops or layers. This enables a precise and material conserving encasing of the electronic interconnect device.

In one embodiment of the present disclosure, the electronic interconnect device is heated to the cross-linking temperature of the encapsulating material. For practical purposes, the heating occurs in a step prior to the application of the encapsulating material to the interconnect device. The cross-linking temperatures of the different materials for a 3D printing process are known from the prior art. The cross-linking temperature is the temperature thereby, at which the 3D printing material, thus the encapsulating material, bonds in an optimal manner to the substance, thus the electronic interconnect device.

In one embodiment of the present disclosure, the electronic interconnect device is cleaned by means of a washing process prior to applying the encapsulating material. In this manner, it is ensured that an optimal bond can be obtained between the encapsulating material and the electronic interconnect device.

The method according to the present disclosure can be used, in particular, in the production and treatment of sensors and/or control devices for motor vehicles, in particular in the production of transmission control devices for motor vehicles.

Another aspect of the present disclosure is based on a circuit module having a housing, wherein the circuit module has an electronic interconnect device, wherein the interconnect device is populated with at least one electronic component, and wherein the interconnect device and the at least one electronic component are covered in a material-bonded manner, at least in part, with an encapsulating material, such that the encapsulating material forms the housing. The embodiments of the present disclosure are distinguished in that the encapsulating material is a material that can be applied to the interconnect device by means of a 3D printing process.

In one embodiment of the present disclosure, the encapsulating material covers the interconnect device and the at least one electronic component on an upper and/or lower surface of the interconnect device, in sections or entirely, or the encapsulating material encompasses the interconnect device and the at least one electronic component entirely. The extent of the encapsulating material over the interconnect device can thus be adapted on an individual basis to the respective embodiment of the population of the interconnect device.

The electronic circuit module can be a control device or a part of a control device in a motor vehicle, in particular a control device for a transmission control in a motor vehicle.

BRIEF DESCRIPTION OF THE DRAWINGS

The embodiments of the present disclosure shall be explained below based on the Figures. Therein.

DETAILED DESCRIPTION

Figure 1:
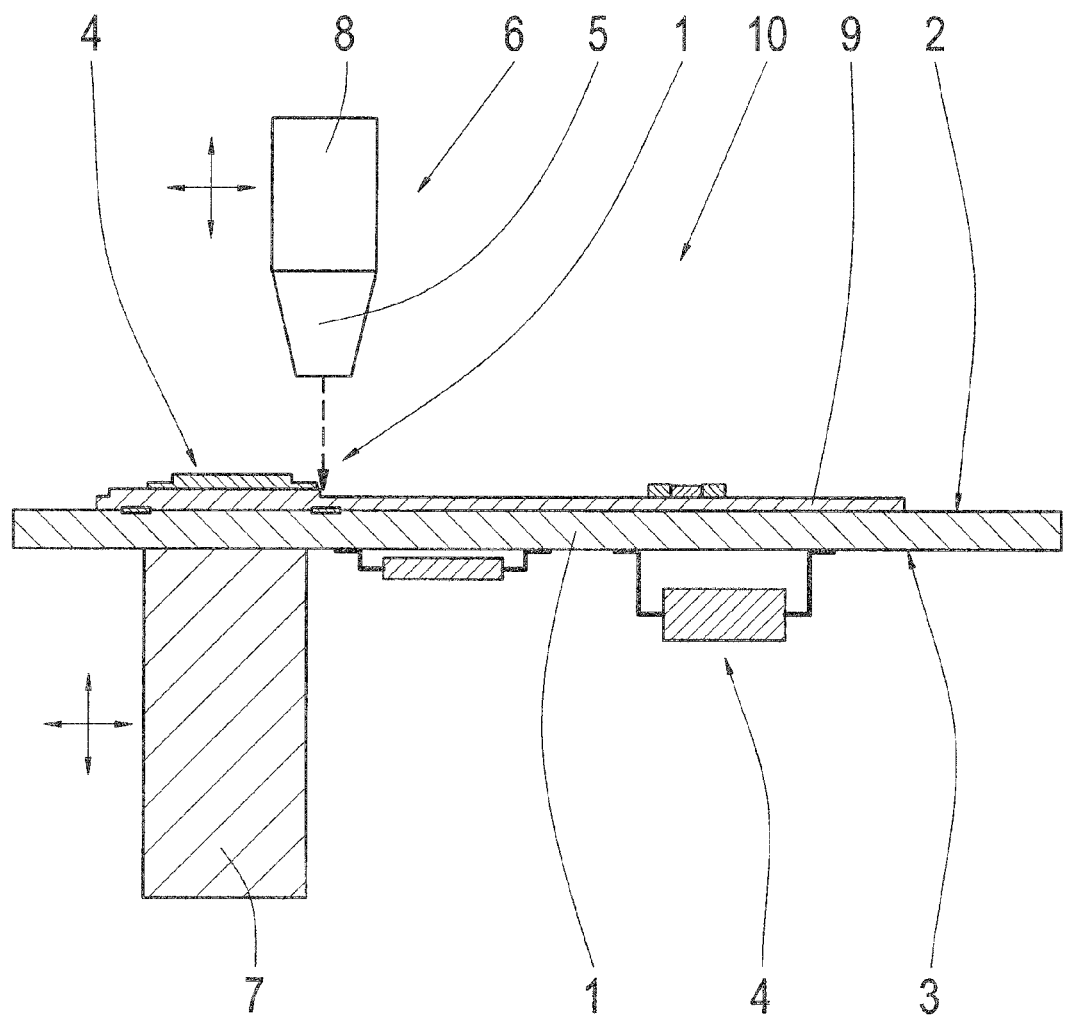
FIG. 1 shows an exemplary construction for executing an 3D printing process according to the present disclosure.

FIG. 1 shows an exemplary construction for executing a 3D printing process according to the present disclosure for producing a circuit module 10. An electronic interconnect device 1 of the circuit module 10 has an upper surface 2 and a lower surface 3. The upper surface 2 and the lower surface 3 are populated with electronic components 4. A nozzle 5 of a 3D printer 6 is disposed above the electronic interconnect device 1. This nozzle 5 can move in all spatial directions (directional arrows) in accordance with a known 3D printer 6. Alternatively or additionally, it is also possible for the interconnect device 1 to be disposed on a holding device 7, which can move the interconnect device 1 in all spatial directions (directional arrows). This holding device 7 can also be designed such that it serves as a heating plate for heating the interconnect device 1 to the desired cross-linking temperature of the printing material of the 3D printer. The printing material is located in a reservoir 8 provided in the 3D printer.

By way of example, a layer of an encapsulating material 9 is depicted on the upper surface 2 of the interconnect device 1. This encapsulating material, applied to the interconnect device 1, serves as a housing for the interconnect device 1. It can be seen that a further layer is applied by means of the 3D printing process in the region of the electronic components 4 on the upper surface 2 of the interconnect device 1, wherein the encapsulating material 9 is deployed from the nozzle 5 toward the upper surface 2 of the interconnect device. It is thus possible to apply the encapsulating material 9 locally, and to adapt the height of the respective layer to the local conditions of the electronic interconnect device 1, e.g. the height of an electronic component 4 with respect to an upper surface of the interconnect device 1.

In accordance with the prior art pertaining to 3D printing, a pretreatment or pre-heating of the material 9 that is to be printed occurs in the nozzle 5 of the 3D printer 6. This material 9 is subsequently applied to the interconnect device 1 via the nozzle 5 in drops or layers.

Figure 2:
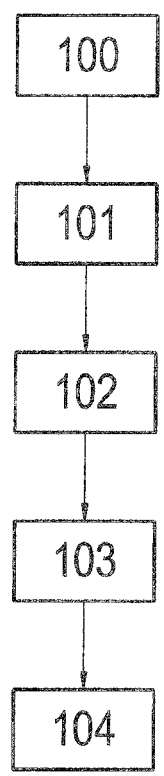
FIG. 2 shows the method sequence according to the present disclosure.

FIG. 2 shows an exemplary sequence of a method according to the present disclosure. In a first step 100, an electronic interconnect device is provided. Subsequently, in a further step 101, the interconnect device is cleaned of dust, etc. In a further step 102, the cleaned interconnect device is placed in a 3D printer. Subsequently, in a further step 103, the interconnect device is heated to a desired temperature, ideally to the cross-linking temperature of the printing medium (encapsulating material). In the subsequent printing process, in step 104, the encapsulating material is prepared in the 3D printer, in particular it is melted, and printed onto the interconnect device via a nozzle, in particular it is applied thereto.

REFERENCE SYMBOLS 1 interconnect device
2 upper surface
3 lower surface
4 electronic component
5 nozzle
6 3D printer
7 holding device
8 reservoir
9 encapsulating material
10 circuit module
100 provision of an interconnect device
101 cleaning of the interconnect device
102 placement of the interconnect device in a 3D printer
103 heating of the interconnect device
104 printing of the interconnect device

I claim:

1. A method for protecting an electronic interconnect device from environmental effects, wherein the electronic interconnect device is connected to at least one electronic component on both upper and lower surfaces, and wherein the electronic interconnect device and the at least one electronic component are entirely encompassed with an encapsulating material by a 3D printing process, the method comprising: heating the electronic interconnect device to a cross-linking temperature of the encapsulating material by a holding device on the surface opposite to a 3D printer; and applying the encapsulating material to an area of the electronic interconnect device with the cross-linking temperature by the 3D printer during the 3D printing process.

2. The method according to claim 1, wherein the encapsulating material is melted during the 3D printing process and applied to the electronic interconnect device with the 3D printer in drops or layers.

3. The method according to claim 1, further comprising cleaning the electronic interconnect device prior to the application of the encapsulating material.

4. The method of claim 1, further comprising the step of providing the electronic interconnect device.

5. The method of claim 1, wherein the interconnect device is disposed on a holding device during the 3D printing process, where the holding device can move the interconnect device with respect to the 3D printer.

6. The method of claim 1, wherein the interconnect device is disposed on a holding device during the 3D printing process, where the holding device is configured to heat the interconnect device to a cross-linking temperature of the encapsulating material.

7. The method of claim 1, wherein the encapsulating material is applied in layers with a varying height across a surface of the electronic interconnect device.

8. The method of claim 1, wherein the encapsulating material is heated in the 3D printer prior to being applied.

* * * * *